United States Patent
Graas et al.

(10) Patent No.: US 6,355,983 B2
(45) Date of Patent: *Mar. 12, 2002

(54) SURFACE MODIFIED INTERCONNECTS

(75) Inventors: Carole D. Graas, Dresden (DE); Robert H. Havemann, Garland, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,010

(22) Filed: Jun. 10, 1998

Related U.S. Application Data

(60) Provisional application No. 60/049,178, filed on Jun. 11, 1997.

(51) Int. Cl.$^7$ .......................... H01L 23/48; H01L 23/52
(52) U.S. Cl. ................. 257/763; 257/764; 257/751; 257/767; 257/771
(58) Field of Search ..................... 257/763, 764, 257/753, 757, 762, 771, 767, 751; 438/688, 687, 658, 648, 644, 636, 628, 627, 625, 622, 618

(56) References Cited

U.S. PATENT DOCUMENTS

| | | | |
|---|---|---|---|
| 5,321,211 A | | 6/1994 | Haslam et al. ............... 174/262 |
| 5,360,995 A | | 11/1994 | Graas .......................... 257/751 |
| 5,565,708 A | * | 10/1996 | OHasaki et al. ............. 257/764 |
| 5,700,718 A | * | 12/1997 | McTeer ....................... 437/192 |
| 5,714,804 A | * | 2/1998 | Miller et al. ................. 257/763 |
| 5,814,560 A | * | 9/1998 | Cheung et al. ............. 438/648 |
| 5,913,147 A | * | 6/1999 | Dubin et al. ................ 438/687 |
| 5,969,422 A | * | 10/1999 | Ting et al. ................... 257/762 |
| 6,043,148 A | * | 3/2000 | Peng et al. .................. 438/628 |
| 6,054,768 A | * | 4/2000 | Givens et al. ............... 257/753 |
| 6,060,382 A | * | 5/2000 | Lee ............................. 438/622 |
| 6,074,943 A | * | 6/2000 | Brennan et al. ............ 438/636 |
| 6,077,774 A | * | 6/2000 | Hong et al. ................. 438/643 |
| 6,091,148 A | * | 7/2000 | Givens et al. ............... 257/750 |

OTHER PUBLICATIONS

1985 American Institute of Physics, J. Appl. Phys. 58(2), Jul. 15, "Formation of Ultrathin Tungsten Filaments Via Selective Low Pressure Chemical Vapor Deposition", pp 987–989 (H.H. Busta, A.D. Feinerman, J.B. Ketterson and G.K. Wong).

1996 American Vacuum Society, J. Vac. Sci. Technol. B 14(3), May/Jun., "Step Coverage Comparison of Ti/TiN Deposited Collimated and uncollimated Physical Vapor Deposition Techniques," pp 1846–1852 (Shi–Qing Wang, James Schlueter, Carolyn Gondran and Ted Boden).

\* cited by examiner

Primary Examiner—Steven Loke
Assistant Examiner—Douglas W. Owens
(74) Attorney, Agent, or Firm—Jacqueline J. Garner; W. James Brady, III; Frederick J. Telecky, Jr.

(57) ABSTRACT

An interconnect structure having refractory sidewalls 240 for enhanced yield, performance and reliability. The primary purpose of the refractory metal 240 is to getter sidewall impurities, residual polymers, and corrosive species by-products from the plasma etch and cleanup processes used to pattern interconnects. In a preferred embodiment, the refractory metal 240 reacts with the conducting layer 210 to form an intermetallic 245 which further enhances the endurance of the metallization against stress-induced rupturing and via-induced electromigration. The disclosed structures and methods are particularly advantageous in "zero-overlap" designs, and aggressive pitch patterns where linewidth and corrosion control are critical, but are also advantageous in "Damascene" pattern definition applications.

1 Claim, 4 Drawing Sheets

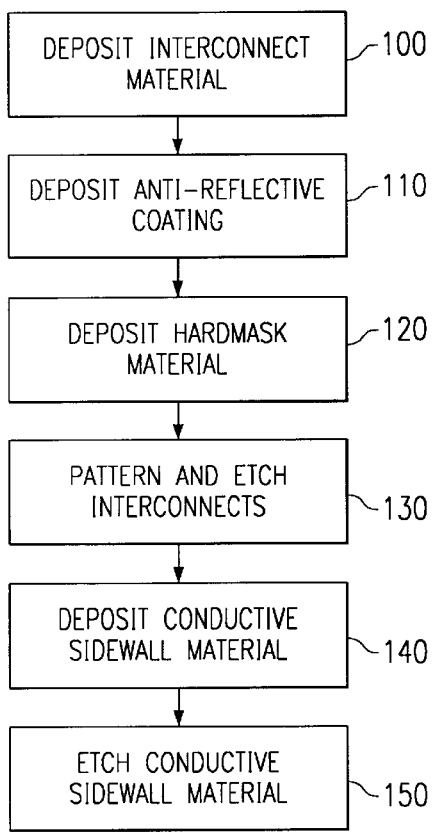
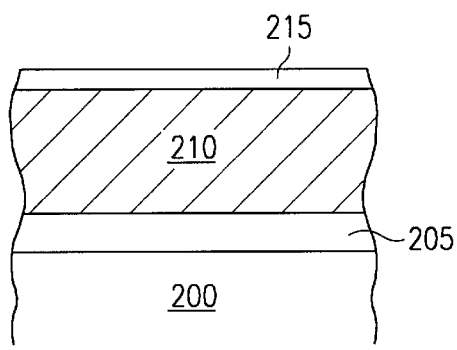
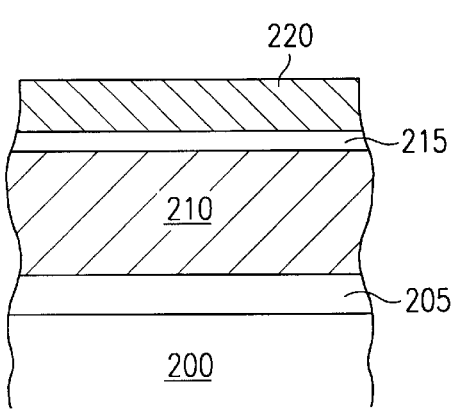
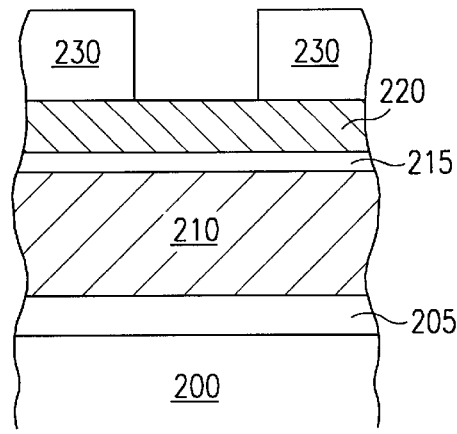

SURFACE MODIFIED INTERCONNECTS

This application claims priority under 35 USC §119 (e) (1) of provisional application No. 60/049,178, filed Jun. 11, 1997.

BACKGROUND AND SUMMARY OF THE INVENTION

The present invention relates to interconnect structures and fabrication methods.

Background: Aluminum Metallization

Aluminum-based interconnects have been widely used for more than twenty years. With the rapid scaling of device dimensions, fine and highly reliable aluminum-based interconnects are required. However, fine interconnects are susceptible to failures due to higher mechanical stress and electron wind stress (electromigration). Electromigration is a phenomenon where fine metal lines will gradually develop gaps in response to current passing through them. Stress-induced metal ruptures are caused by void formation which occurs at specific grain boundaries where the <111> planes of adjoining grains come into contact. Moreover, stress-induced voiding affects electromigration failure because of the flux divergence around the voids.

The addition of copper greatly improves the electromigration (EM) lifetime of aluminum interconnects. Longer EM lifetimes improve the product reliability. Thus, typical aluminum alloys may use silicon (typically one-half percent to one percent atomic) or copper (typically one-half percent to one percent atomic) or both as alloying agents. Efforts have been made to find other satisfactory aluminum alloy compositions; see e.g. Kikuta and Kikkawa, "Electromigration characteristics for Al—Ge—Cu," 143 J. Electrochem. Soc. 1088 (1996), which is hereby incorporated by reference.

In addition, as metal spacing becomes tighter and current density in metal leads increases, side hillocks become an important issue. This may be especially true for structures which include soft low density dielectrics, such as polymers and xerogels, between the interconnects. Furthermore, there are many dielectric materials which can not reliably be applied directly to a wafer when aluminum, exposed during a metal etch, is not first covered with some other material. Additionally, residues left on the sidewalls of interconnects after metal etch may contain chlorine or other elements which can promote corrosion. The addition of copper to the aluminum interconnect further increases the susceptibility of the interconnect to corrosion. Also, the solvents in which some dielectric materials are delivered may promote corrosion. A discussion of the corrosion susceptibility of aluminum alloy films is discussed in the following article: Lawrence et al., "Corrosion Susceptibility of Al—Cu and Al—Cu—Si Films," IEEE/IRPS, p.102–06 (1991), which is hereby incorporated by reference.

One conventional approach to the problems of metal corrosion and dielectric adhesion is to deposit a barrier layer immediately following metal etch and clean-up. This layer serves to protect the metal lines by acting as a barrier to moisture (which could react with the residue on the side of the line) and other chemicals, and by acting as a "buffer" or "adhesion" layer to subsequently deposited dielectrics. However, the barrier layer is usually a dielectric material, such as silicon oxide or PETEOS, which may not necessarily be conformally deposited. Additionally, most dielectric materials neither possess sufficient diffusion barrier properties nor provide sufficient adhesion for the subsequent dielectric deposition.

Background: Reactive Refractory Metals

Reactive refractory metals (such as titanium) are advantageous for use in via hole applications due to their ability to getter impurities. Furthermore, when a reactive refractory metal is deposited on the top or bottom of an interconnect, the refractory metal can react with the metal interconnect (e.g. aluminum alloy) to form an intermetallic, which advantageously enhances the electromigration robustness of the interconnect.

For example, as described in U.S. Pat. No. 5,360,995 to Graas, which is hereby incorporated by reference, an intermetallic buffer layer on top of the interconnect can be formed by depositing a thin metal, such as titanium, between the interconnect material (e.g. aluminum) and the anti-reflective coating. Heating the metal causes it to react with the aluminum and form an intermetallic coating. The intermetallic coating protects the underlying interconnect material during via etching by providing a buffer that the etch can stop in.

Background: Via Misalignment

As device dimensions shrink, the overlap between the edges of vias and the edges of interconnects decreases. If a via is patterned such that it is not directly over an interconnect, the area of the via not overlying the interconnect may be too small (e.g. 50–100 nm) to be sputter-filled with a barrier layer prior to filling the vias with an additional metal (e.g. tungsten). This unadvantageously leaves at least part of the interconnect sidewall exposed during the subsequent tungsten deposition, which can corrode the aluminum interconnect. Also, there may be materials between the interconnects, which if exposed during via etch, can cause problems during the filling of the vias, such as via poisoning. The occurrence of via misalignment increases in "zero-overlap" via/interconnect designs, in which the area of the interconnect equals the area of the via.

One conventional approach of ensuring a reliable contact will still be made in the event of an error in contact via placement is to form a thick buffer region 620, which can be composed of a dielectric, conductive nitride, polysilicon, or metal, on the sidewalls of the interconnect 610 to serve as an etch stop in order to protect the underlying layer 600, as shown in prior art FIG. 6. The buffer regions serve to significantly increase the line to space ratio, as discussed in U.S. Pat. No. 5,321,211 to Haslam et al., which is hereby incorporated by reference.

Conductive Sidewall Interconnect Structures and Methods

The present application discloses an interconnect structure having thin conductive sidewalls for enhanced yield, performance and reliability. This conductive sidewall is generally a refractory metal, but may also be a nitride, such as TiN. The primary purpose of the conductive sidewalls is suppress the formation of hillocks and to improve the electromigration resistance. Secondary purposes include gettering sidewall impurities, residual polymers, and corrosive species by-products from the plasma etch and cleanup processes used to pattern interconnects. In a preferred embodiment, a refractory metal reacts with the conducting layer to form an intermetallic which further enhances the endurance of the metallization against stress-induced ruptures and via-induced electromigration. Unlike the Haslam patent, which uses a thick sidewall buffer layer as an etch stop, the present inventors have discovered that the use of a thin conductive sidewall layer and/or alloyed region increases the electrical/structural reliability of interconnect structures, without significantly increasing the line to space ratio. The disclosed structures and methods are particularly advantageous in "zero-overlap" designs, and aggressive pitch patterns where linewidth and corrosion control are critical, but are also advantageous in "Damascene" pattern definition applications.

Advantages of the disclosed methods and structures include:

- increases back-end-of-line yield by saving misaligned vias;
- reduces the occurrence of associated failure mechanisms (such as certain types of intra-level oxide breakdown mechanisms) by avoiding leakage paths due to etch residues left on interconnect sidewalls;
- lowers the resistance and improves the reliability of "zero-overlap" vias;
- requires only a blanket deposition/etch for a very thin metal film;
- does not impact linewidth control;
- better sidewall rupturing endurance (because the intermetallic puts the aluminum sidewall under compression);
- improved corrosion resistance;
- enhanced resistance to hillock formation;
- enhanced resistance to stress-voiding formation; and
- gettering of impurities from the sidewalls of the interconnects.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1 shows a process flow for fabricating interconnects with conductive sidewall layers;

FIGS. 2A–2F illustrate the formation of interconnects with conductive sidewalls in accordance with preferred embodiments of the present invention;

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

As shown in the process flow of FIG. 1 and schematically illustrated in FIGS. 2A–2F, interconnects with thin layers of sidewall material can be formed, in accordance with preferred embodiments of the present invention, by first sputter depositing, over a dielectric layer 200, a layer of interconnect material 210 (step 100) (e.g. Al—Cu, with 0.1 to 5 percent atomic of copper). Optionally, a barrier and adhesion layer 205 (e.g. titanium nitride) can be deposited over the dielectric 200 prior to deposition of the interconnect material.

Figure 2D:
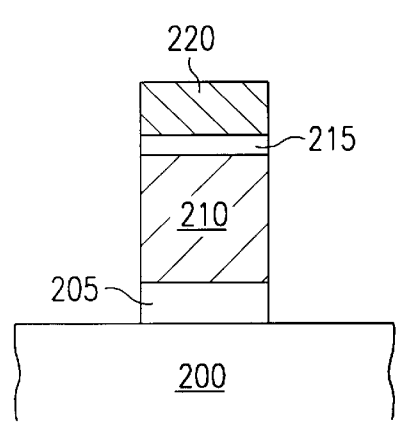

Subsequently, an anti-reflective coating layer 215 (e.g. TiN) can be deposited (step 110) over the metal layer 210, as can be seen in FIG. 2A. Thereafter, as shown in FIG. 2B, the hardmask material 220 is deposited (step 120) on anti-reflective coating 215, followed by the patterning, using a photoresist 230, and etching of the interconnects (step 130) to form adjacent metal lines, which is illustrated in the cross-sectional views of FIGS. 2C and 2D. The hardmask material 220 is preferably an oxide, such as silicon dioxide, which provides an etch stop to protect the top of the interconnect during the etchback of the sidewall material.

Figure 2E:
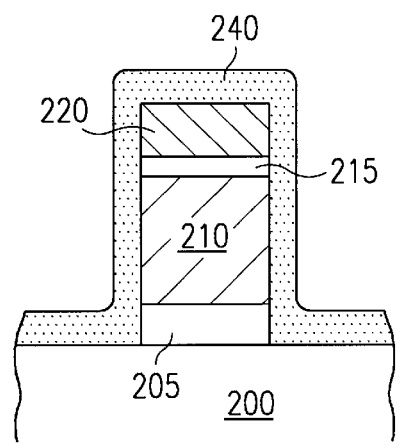
Figure 2F:
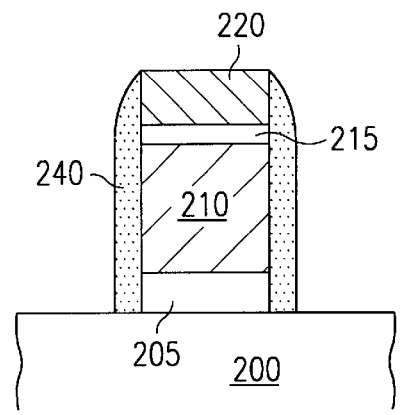

The conductive sidewall material 240 (e.g., titanium) is then blanket deposited (step 140) over the metal interconnects and anisotropically etched (step 150) (i.e. using a chloro etch) to leave the thin layer of sidewall material 240 on only the sides of the interconnects, as shown in FIGS. 2E and 2F. During the etchback of the sidewall material 240 (step 140), the top corners of the interconnects are protected by the hardmask material 220. The thin conductive sidewalls advantageously getter impurities and control the corrosion of the interconnects by completely covering the interconnect sidewalls. In addition, the conductive sidewalls enhance the electromigration resistance of the interconnects.

First Process Embodiment: Thin Conductive Sidewalls

In one preferred embodiment, layer 210 is Al—Cu with 0.1 to 5 percent atomic of copper. It is sputter deposited to a depth of 500 nm over an oxide layer in a single wafer cluster high vacuum tool. Optionally, a layer of titanium nitride (TiN) with a thickness of around 20 to 50 nm, but preferably 30 nm, can be deposited in a titanium target chamber prior to transferring the wafer to an aluminum alloy target chamber to deposit the interconnect material without exposing the wafer to an air ambient.

Subsequently, a layer of TiN having a thickness of approximately 20 to 50 nm, but preferably 30 nm, can be deposited as an anti-reflective coating layer over the Al—Cu. Thereafter, silicon dioxide, or other oxide is deposited to a depth of approximately 50 nm, followed by the patterning and etching of the Al—Cu to form the desired layout. The plasma etch chemistry typically uses a fluorine gas species (e.g. CF4) to etch the oxide and a chlorine gas species (e.g. BC13 and C12) for the Al—Cu.

A thin layer of titanium, between 10 and 50 nm, but preferably 30 nm is then blanket deposited, typically by chemical vapor deposition (CVD), to form the conductive sidewall material. The titanium is etched with an anisotropic etch, such as a chloro etch, to leave the thin layer of sidewall material 240 on only the sides of the Al—Cu interconnects.

Second Process Embodiment: Intermetallic Formation

Figure 3:
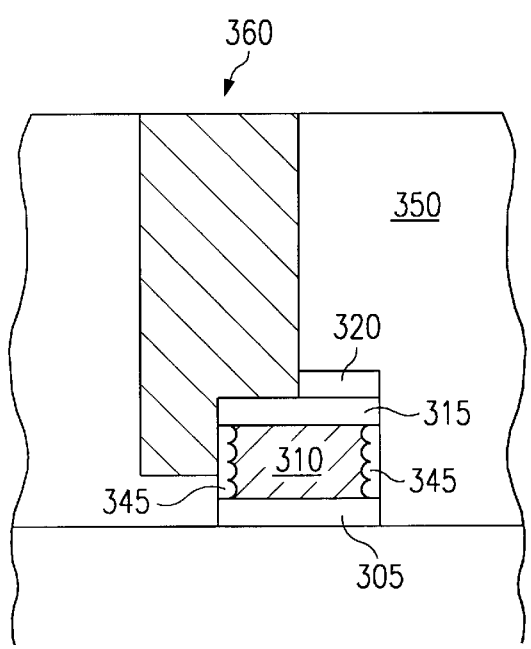
FIG. 3 is a cross-sectional diagram of a via-interconnect interface with via misalignment using preferred embodiments of the present invention.

In a preferred embodiment, due to the very small thickness of the refractory sidewall film (e.g. 20 nm), a short, low-temperature anneal step (e.g. 400 to 450 degrees C. for 30 minutes) can be added prior to or after the etchback of the sidewall material to react the sidewall material with the interconnect material and form an intermetallic 345 (e.g. AlxTiy), as shown in FIG. 3. Thereafter, the non-reacted conductive sidewall material is preferably removed, using for example hot H2O2, before the integlevel dielectric 350 deposition (e.g. a stack of TEOS/Hydrogen Silsesquioxane (HSQ)/TEOS with a total thickness of approximately 800 nm) and via plug 360 (e.g. tungsten) formation, so that an intermetallic layer 345 is present only on the sides of the interconnects 310. As can be seen in FIG. 3, no sidewall material or intermetallic material is present on the anti-reflective coating layer 315, the hardmask layer 320, or the underlying barrier layer 305.

The intermetallic 345 advantageously improves the sidewall rupturing endurance because the intermetallic 345 puts the interconnect 310 sidewall under compression. This layer 345 can also advantageously enhance the quality of the via-interconnect interface 360–310 in the case of via misalignment, which is most likely to occur in "zero-overlap" via designs, by protecting the interconnect 310 from corrosive or reactive agents during the via-fill process. Therefore, the size and alignment tolerances of the via and the interconnect are related such that via misalignment is allowed. (although the sizes of the via and interconnect do not have to be equivalent).

Third Process Embodiment: Intermetallic and Metal Sidewalls

In an alternative embodiment, after the formation of the interconnects, and during thermal cycling required to form the interlevel dielectric (i.e. when curing spin-on glass) and/or the via plug process, the metal sidewall material may react with the metal interconnects to form a continuous intermetallic on the sidewall. The formation of an intermetallic is desirable, but not necessarily required.

Fourth Process Embodiment: No Hardmask or ARC Layer

Figure 4:
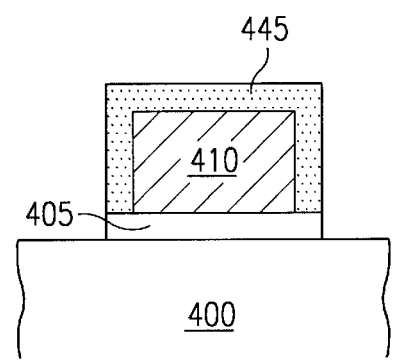
FIG. 4 schematically illustrates the formation of an intermetallic on the surface and sidewalls of a metal interconnect.

In an alternative embodiment, which is illustrated in FIG. 4, the anti-reflective coating (ARC) layer and hardmask layer are not deposited after the deposition of the metal interconnect material 410. The sidewall material can then be deposited directly over the metal interconnects, followed by an anneal (e.g. 400 to 450 degrees C. for 30 minutes) to react the sidewall material with the metal interconnects to form an intermetallic 445 on the sidewalls and surface of the metal interconnects 410. The non-reacted metal is then selectively stripped, using for example hot H2O2, resulting in a thin intermetallic layer 445 on the sidewalls and surface of the metal interconnects 410, but not on the sidewalls of the barrier layer 405 or on the surface of the underlying oxide layer 400.

Fifth Process Embodiment: Hardmask Removed

The embodiment illustrated in FIG. 4 can also be achieved by removing the hardmask and anti-reflective coating between steps 130 and 140, i.e., after the stack has been etched, but before the conductive sidewall material is deposited. An anneal and removal of non-reacted metal would then follow the embodiment above.

Sixth Process Embodiment: Damascene

Figure 5A:
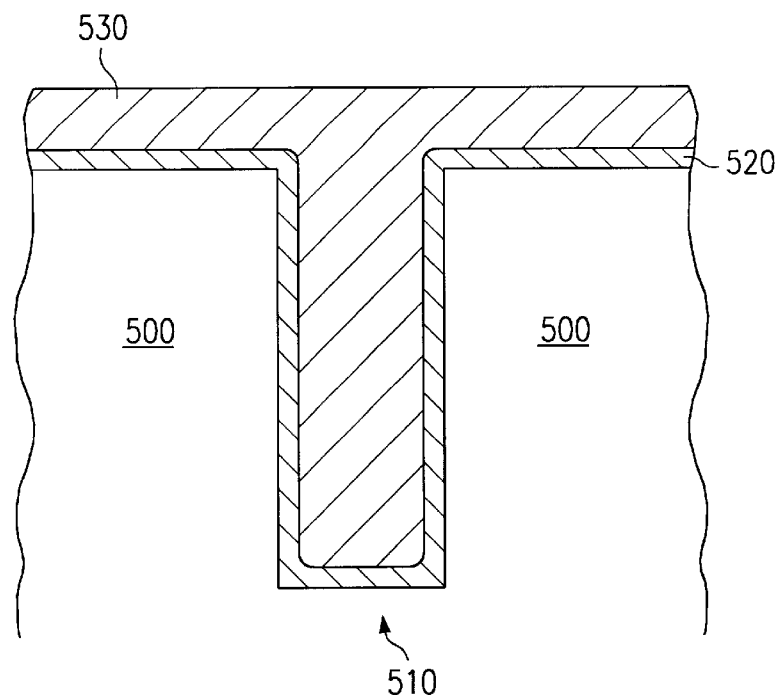
FIGS. 5A–5C show the formation of an intermetallic in a "Damascene" process.

In the case where a "Damascene" process is used, the conductor line can be used to provide the precursor for intermetallic formation. In such processes, as shown in FIG. 5A, an interlevel dielectric 500 (e.g. BPSG over TEOS-deposited SiO2) is patterned and etched to form slots where lines of metallization are desired, and also to form deeper holes 510 where vias are desired (i.e. where an electrical contact to the underlying conductor layer is desired). Thereafter, a thin first conductive layer 520 (e.g. titanium) is blanket deposited to line the sides and bottom of the vias 510. A highly conductive metal 530 (e.g. aluminum or aluminum alloy) is then deposited overall by conventional methods, and etched back and polished, using for example a chemical mechanical polishing (CMP) process, so that the flat surface of the interlevel dielectric 500 is exposed wherever the metal 530 is not present.

Figure 5B:
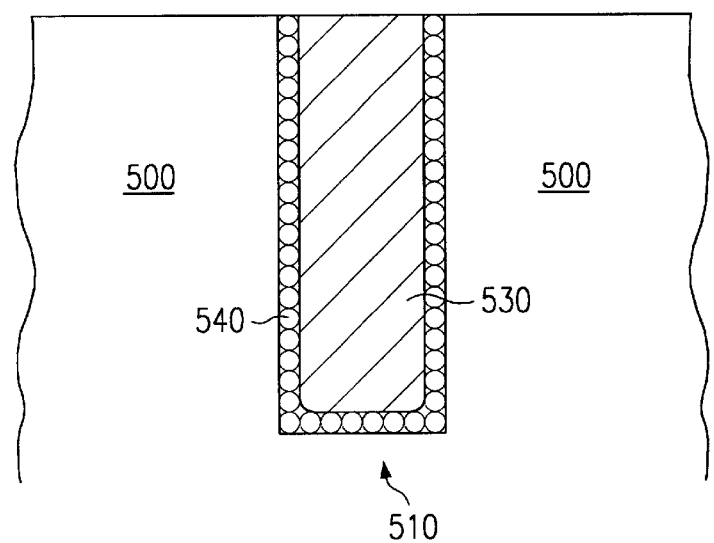
Figure 5C:
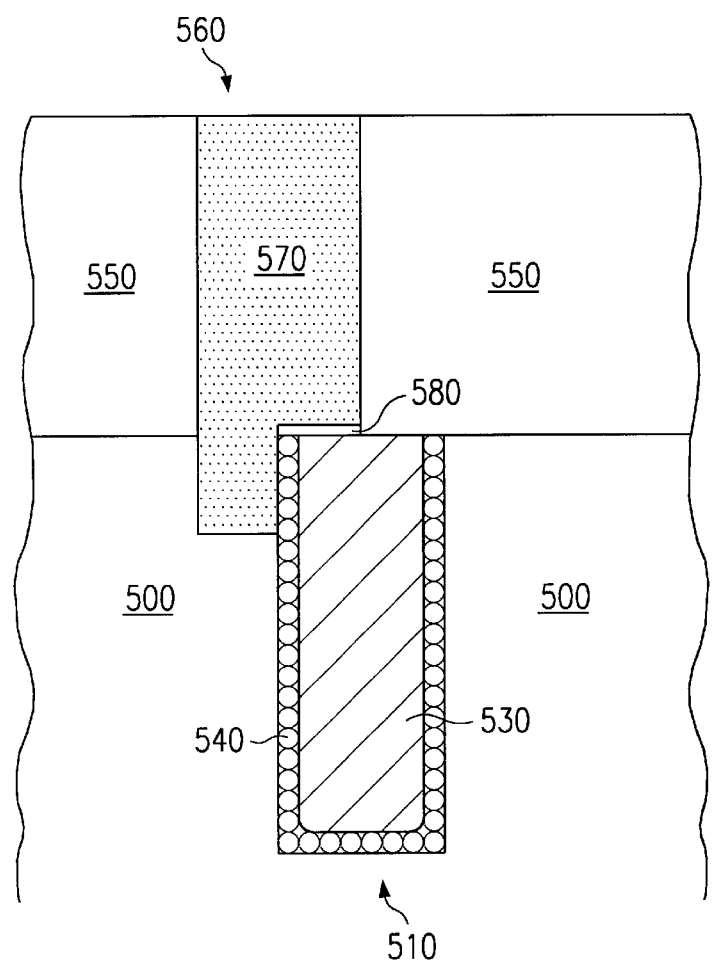
Figure 6:
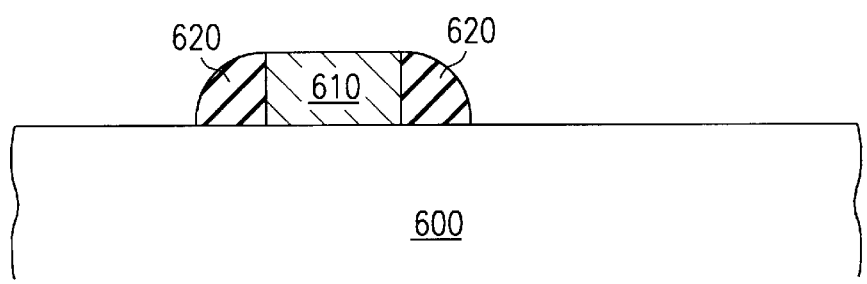
FIG. 6 shows a prior art interconnect structure with thick buffer regions on the sidewalls.

The resulting structure can then be annealed (e.g. at 400 to 450 degrees C. for 30 minutes) to form an intermetallic 540 (e.g. TixAly) on the bottom and sides of the vias 510, as shown in FIG. 5B. This intermetallic 540 advantageously prevents reaction of the metal 530 during subsequent processing. For example, as shown in FIG. 5C, such processing steps can include the deposition, patterning, and etching of an additional interlevel dielectric layer 550 to form overlying vias 560, which can subsequently be filled with an additional metal 570 (e.g. tungsten). In the case of via misalignment, the area of the vias 560 not overlying the bottom metal 530 may be too small (e.g. 50 to 100 nm) to be filled with a barrier layer 580 (e.g. 50 nm of a titanium/TiN stack) prior to the additional metal 570 plug fill, and therefore the intermetallic 540 present on the sides of the bottom metal 530 protects the metal 530 from reaction, which can occur from the interaction between the atmosphere present when the additional metal 570 (e.g. tungsten) is deposited and the bottom metal 530 (e.g. aluminum).

Alternate Hardmask Embodiment: Titanium/TiN

Alternatively, a layer of titanium can be deposited over the TiN anti-reflective coating layer to provide selectivity during the etchback of the sidewall material (e.g. TiN).

Alternate Hardmask Embodiment: Silicon Nitride

Alternatively, a layer of silicon nitride can be used as the hardmask material to provide an etch stop to protect the top of the interconnect during the etchback of the sidewall material.

Alternate ARC Layer Embodiment: Titanium

Alternatively, a layer of titanium can be used as the anti-reflective coating layer.

Alternate ARC Layer Embodiment: TiW

Alternatively, a layer of TiW can be used as the anti-reflective coating layer.

Alternate Barrier/Adhesion Layer Embodiment: Titanium Over TiN

Alternatively, a layer of titanium, which serves as the adhesion layer can be deposited over the TiN barrier layer to separate the oxide substrate from the metal interconnects.

Alternate Interconnect Material Embodiment: Copper

In an alternative embodiment, the metal interconnects can consist essentially of copper.

Alternate Sidewall Material Embodiment: Titanium Nitride (TiN)

For aluminum interconnects, the sidewall material is preferably chemical vapor deposited (CVD) TiN. In order to suppress the formation of hillocks on the sidewalls, an anneal step is not used, and thus an intermetallic is not formed on the interconnect sidewalls.

Alternate Sidewall Material Embodiment: Copper

In an alternative embodiment, when using aluminum interconnects, the sidewall material can consist essentially of copper.

Alternate Sidewall Material Embodiment: Tantalum

For copper interconnects, the sidewall material can be formed from tantalum to improve the reliability of the interconnects.

Alternate Sidewall Material Embodiment: Molybdenum

Alternatively, for copper interconnects, molybdenum can be deposited on the sidewalls to improve the reliability and strengthen the electromigration resistance of the interconnects.

Alternate Sidewall Material Embodiment: Zirconium

Alternatively, zirconium can be deposited on the sidewalls to improve the reliability and strengthen the electromigration resistance of the interconnects.

Alternate Sidewall Material Embodiment: Hafnium

Alternatively, hafnium can be deposited on the sidewalls to improve the reliability and strengthen the electromigration resistance of the interconnects.

Alternate Sidewall Material Embodiment: Chromium

Alternatively, chromium can be deposited on the sidewalls to improve the reliability and strengthen the electromigration resistance of the interconnects.

Alternate Sidewall Material Embodiment: Palladium

Alternatively, palladium can be deposited on the sidewalls to improve the reliability and strengthen the electromigration resistance of the interconnects.

Alternate Sidewall Material Embodiment: Nickel

Alternatively, nickel can be deposited on the sidewalls to improve the reliability and strengthen the electromigration resistance of the interconnects.

Alternate Sidewall Material Embodiment: Vanadium

Alternatively, vanadium can be deposited on the sidewalls to improve the reliability and strengthen the electromigration resistance of the interconnects.

According to a disclosed class of innovative embodiments, there is provided: An integrated circuit interconnect structure, comprising: a patterned metal layer with sidewalls thereon; and a layer of conductive material having a composition different from said metal layer on at least some of said sidewalls of said metal layer; wherein said conductive material has a thickness which is less than twenty percent of the thickness of said metal layer.

According to a disclosed class of innovative embodiments, there is provided: An integrated circuit metallization structure, comprising: a metal layer within slots in an interlevel dielectric layer having a planar surface; wherein said metal layer has an alloyed composition at the surface thereof on the bottom and sidewalls of said slots, said alloyed composition being different from the average composition of said metal layer.

According to another disclosed class of innovative embodiments, there is provided: A method of fabricating an interconnect structure, comprising the steps of: (a.) depositing, on a patterned metal layer having sidewalls, a layer of conductive material having a thickness which is less than twenty percent of the thickness of said metal layer; and (b.) etching said conductive material to leave said conductive material on at least some of said sidewalls of said metal layer; wherein said conductive material getters impurities from said sidewalls of said metal layer.

According to another disclosed class of innovative embodiments, there is provided: A method of fabricating a metallization structure, comprising the steps of: (a.) depositing a first conductive layer within slots in an interlevel dielectric layer to coat the sidewalls and bottom of said openings; (b.) depositing a metal layer overall and etching said metal layer and said first conductive layer to remove said metal layer and said first conductive layer from the surface of said dielectric layer, but not from within said openings; and (c.) reacting said metal layer and said first conductive layer to form an intermetallic on the sidewalls and bottom of said openings; whereby said metal layer is passivated on said sidewalls.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the number of layers of metallization described above does not implicitly limit any of the claims, which can be applied to processes and structures with more or fewer layers.

Of course, a wide variety of materials, and of combinations of materials, can be used to implement the metal layer(s).

The following materials are further examples of materials that can serve as barrier layers: TiAlN, TiSiN, WSiN, TaSiN, TiWN, WN, CrN, and CrAlN.

Of course, the specific etch chemistries, layer compositions, and layer thicknesses given are merely illustrative, and do not by any means delimit the scope of the claimed inventions.

Silicon oxynitride can also optionally be substituted where silicon nitride is used in the presently preferred embodiment.

What is claimed is:

1. An integrated circuit interconnect structure, comprising:
    a patterned metal layer with sidewalls thereon;
    a diffusion barrier directly adjacent a bottom surface of said metal layer; and
    a layer of conductive material having a composition different from said metal layer and said diffusion barrier, said layer of conductive material located on a top surface of said metal layer and on at least some of said sidewalls of said metal layer but not on sidewalls of said diffusion barrier;
    wherein said conductive material has a width, from side to side, which is less than twenty percent of the thickness, from top to bottom, of said metal layer; and
    wherein said conductive material is an intermetallic compound.

* * * * *